United States Patent [19]

Yerman

[11] 3,922,705

[45] Nov. 25, 1975

[54] DIELECTRICALLY ISOLATED INTEGRAL SILICON DIAPHRAM OR OTHER SEMICONDUCTOR PRODUCT

[75] Inventor: Alexander J. Yerman, Scotia, N.Y.

[73] Assignee: General Electric Company, Schenectady, N.Y.

[22] Filed: Nov. 27, 1974

[21] Appl. No.: 527,550

Related U.S. Application Data

[63] Continuation of Ser. No. 366,379, June 4, 1973, abandoned.

[52] U.S. Cl. .......................... 357/26; 357/73; 338/2; 338/4; 338/5; 73/88 SD

[51] Int. Cl.² ..................... H01L 29/84; H01L 29/96

[58] Field of Search .............. 357/26, 40, 73; 338/2, 338/4, 5; 73/88 SD

[56] References Cited

UNITED STATES PATENTS

| | | | |
|---|---|---|---|
| 2,620,598 | 12/1952 | Purser et al. | 357/73 |
| 3,399,390 | 8/1968 | Shahbender | 357/73 |
| 3,602,981 | 9/1971 | Kooi | 357/40 |
| 3,695,956 | 10/1972 | Speers | 357/40 |
| 3,764,950 | 10/1973 | Wallia | 357/26 |

OTHER PUBLICATIONS

Journal of Electrochem. Society; Solid State Science; Glass Source B Diffusion in Si and Sio₂ by D. M. Brown, et al. pp. 293–300.

*Primary Examiner*—Andrew J. James
*Attorney, Agent, or Firm*—Donald R. Campbell; Joseph T. Cohen; Jerome C. Squillaro

[57] ABSTRACT

A dielectrically isolated, pressure responsive silicon diaphragm includes a single crystal substrate bonded to a single crystal strain gage component with an intermediate insulating layer and glass bonding layer. The boric oxide enriched glass has a lower softening temperature than the insulating layer and semiconductor and a matching expansion coefficient. Illustratory products are integral silicon diaphragms, integrated circuits, and power devices for high temperature applications where junction isolation is useless. In the method of fabrication the composite is bonded at elevated temperature under pressure and the temporary substrate is removed mechanically and by a final preferential etch. Active components with thinner semiconductor layers of uniform thickness can be produced.

1 Claim, 11 Drawing Figures

DIELECTRICALLY ISOLATED INTEGRAL SILICON DIAPHRAM OR OTHER SEMICONDUCTOR PRODUCT

This is a continuation of application Ser. No. 366,379, filed June 4, 1973, and now abandoned.

BACKGROUND OF THE INVENTION

This invention relates to dielectrically isolated single crystal semiconductor structures or components. More particularly, the invention relates to single crystal silicon structures with dielectrically isolated silicon components such as integral silicon diaphragms, monolithic and hybrid integrated circuits, and power semiconductors for high temperature or high radiation environment applications.

In most currently employed processes for the dielectric isolation of solid state components, polycrystalline silicon is grown on an oxidized single crystal silicon wafer to serve as the final substrate for isolated areas of silicon formed from the single crystal silicon. This process becomes less effective as the thickness of the isolated single crystal layer is reduced. Since the final thickness is achieved by chemical-mechanical polishing, any variations in thickness of the original silicon wafer or in its flatness after the polycrystalline growth operation result in non-uniform thickness of the final isolated silicon layer. This variation is typically of the order of ±5 microns so that the yield of isolated silicon area decreases rapidly as its thickness is reduced below approximately 10 microns. Additionally, in some applications, this approach has distinct disadvantages for many solid state components and integrated circuits because of the inferior mechanical properties of the polycrystalline silicon and differences in expansion coefficient between it and the single crystal silicon component or structure. A more desirable semiconductor product is obtained by providing thinner layers of the original single crystal silicon, from which the component will be made with better thickness uniformity and smaller thickness, with a dielectrically isolated single crystal substrate. An essential pre-requisite to realizing such semiconductor structures is a bonding process that takes place at a sufficiently low temperature so as to have no effect on the silicon dioxide insulating layer and previously fabricated single crystal silicon component. A suitable bonding process for this application is described in the inventor's concurrently filed application Ser. No. 366,380, assigned to the same assignee as this invention. Another desirable and unique processing step is the preferential etching of silicon using heavily doped p-silicon as an etch stop, which is claimed in another concurrently filed application Ser. No. 366,377 by the same inventor, assigned to the same assignee, now abandoned. The present application is directed to the dielectrically isolated single crystal semiconductor products per se including those listed previously.

SUMMARY OF THE INVENTION

In accordance with the invention, the new dielectrically isolated single crystal semiconductor product is comprised by a single crystal structure, such as an active or passive solid state component or a substrate for the subsequent fabrication of such components, bonded to a single crystal substrate with at least one intermediate insulating layer and glass bonding layer.

The preferred embodiment is a pressure responsive silicon diaphragm with a dielectrically isolated silicon strain gage component or pattern. The glass bonding layer is typically made of an impurity enriched glass, such as boric oxide enriched or aluminum oxide enriched glass, and is characterized by a substantially lower softening temperature than that of the insulating layer and semiconductor. Preferably, the glass layer has a composition with a thermal expansion coefficient matching the expansion coefficient of the semiconductor. For single crystal silicon products with these features, the preferred embodiment uses a silicon dioxide insulating layer, and a 15–20 mole percent boric oxide-silicon dioxide glass layer with a thickness of 0.5–5 microns that is bonded at elevated temperature under pressure for a predetermined time interval. In the final product, the single crystal structure and component can be of the same or opposite conductivity types, and there can be more than one insulating layer and glass bonding layer depending on the requirements of the product and fabrication method selected. A variety of single crystal semiconductor components, devices, and integrated circuits can be fabricated for application in high temperature or high radiation conditions where junction isolation is useless.

As a result of the preferred method of fabrication (not here claimed), a dielectrically isolated solid state component or device can have a thinner geometry with a more uniform thickness than has heretofore been generally possible. In practicing the method, a bonded composite is formed which includes, in addition to the structure described above, a temporary substrate adjacent to a heavily doped p-type layer. It has been found that the complete removal of the final portions of the temporary substrate can be accomplished using a preferential water-amine-complexing agent silicon etch. As an example of an improved component with thinner active regions, a MOS (metal-oxide-silicon) transistor is described.

DESCRIPTION OF THE PREFERRED EMBODIMENTS

A dielectrically isolated single crystal semiconductor structure in accordance with the teaching of the invention, including a suitable method for its manufacture, are illustrated in FIGS. 1–5 with regard to an integral silicon diaphragm with dielectrically isolated silicon strain gage elements. In principle, the semiconductor product can be made from semiconductors other than silicon, and a variety of dielectrically isolated structures or solid state components can be produced including monolithic integrated circuits, hybrid integrated circuits, power semiconductor devices, etc. Similarly, the method of fabrication can be practiced with various alternatives and modifications to some of the steps as will be discussed later.

To produce a pressure sensitive, dielectrically isolated integral silicon diaphragm, a pair of single crystal silicon wafers 11 and 12 are provided, one of which becomes the permanent substrate while the other is a temporary substrate used to fabricate the silicon strain gage elements. Both wafers are polished flat on one face, and have a typical thickness of about 8 mils and a resistivity of 5 ohm-cm. For application as an integral silicon diaphragm substrate, semiconductor wafers 11 and 12 are preferably formed from (110) plane n-type material. Although certain steps in the subsequent processing of wafers 11 and 12 may be performed together, for the sake of clarity the processing of each wafer is discussed separately.

Figure 4:
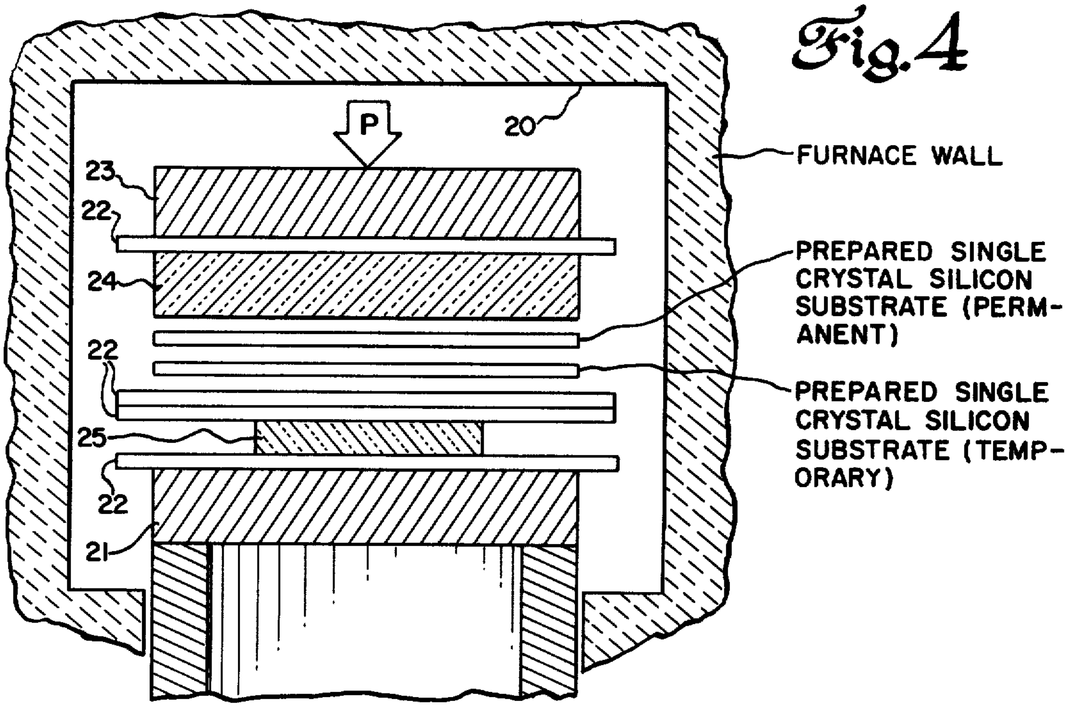
FIG. 4 is a schematic elevational view of an assemblage of lay-ups in a press mounted within a furnace for bonding the prepared single crystal silicon substrates at a pre-selected temperature and pressure.
Figure 5:
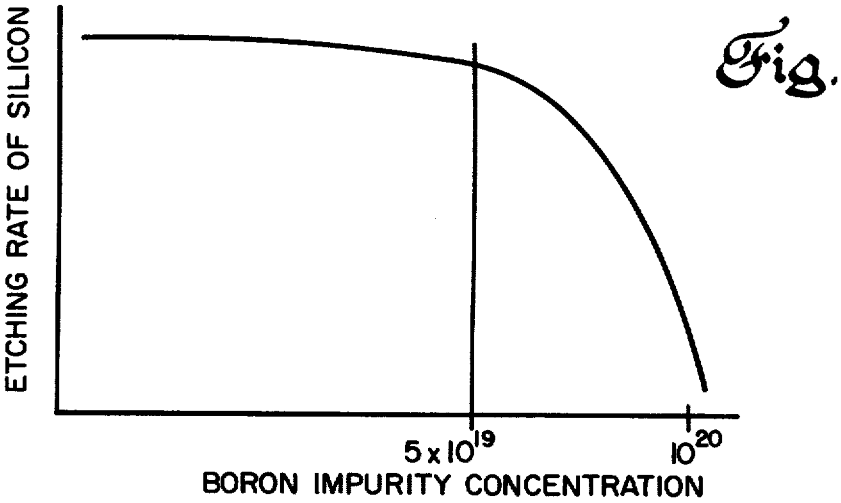
FIG. 5 is a plot of the etching rate of silicon with respect to the boron impurity concentration for the water-amine-complexing agent silicon etchant that is used.

To prepare the permanent silicon substrate 11 for bonding, an insulating layer of silicon dioxide is grown or deposited on the polished flat surface, as by exposure to steam at approximately 1200°C or by the use of some other standard process. As is explained in detail in the previously mentioned application Ser. No. 366,380, a glass bonding layer 14 is deposited on the insulating silicon dioxide layer 13 for the purpose of facilitating bonding to another single crystal silicon surface that is formed on the temporary substrate 12. Preferably, glass bonding layer 14 is a thick layer of a borosilicate glass consisting essentially in mole percent of 15–20 percent boric oxide ($B_2O_3$) and 80–85 percent silicon dioxide ($SiO_2$), which has approximately the same coefficient of expansion as silicon. Usually the glass bonding layer 14 is relatively thick, greater than 0.5 micron and up to 5 microns, while the silicon dioxide insulating layer 13 is usually relatively thin, typically about 1 micron. The desirable characteristic of the glass bonding layer, in addition to its relative thickness and matched thermal expansion coefficient, is that the softening temperature at which it flows under controlled loading, using a bonding apparatus or press such as is shown in FIG. 4, is substantially lower than the comparable temperature for silicon dioxide and silicon. The increase in boron concentration in the glass lowers it softening point. For example, the softening point for this particular glass composition at which the bonding process can take place is 850°C whereas the comparable temperature for silica is 1600°C. Thus, the bonding of one single crystal silicon structure with another dielectrically isolated single crystal silicon structure under pressure at elevated temperature takes place at a sufficiently low temperature so as to have no effect on either structure and the previously fabricated single crystal silicon component.

The boric oxide-silicon dioxide glass film or layer is suitably formed by the low temperature oxidation of silane ($SiH_4$) and diborane ($B_2H_6$), with $O_2$. This can be described briefly as a chemical vapor deposition from a gas mixture containing silane, diborane, and oxygen to form a glassy deposit on a silicon wafer maintained at 300°–500°C. The processing is performed in a quartz reactor, and it is desirable, in addition to using a low deposition temperature, to dilute the oxygen and the silane/diborane mixture with an argon buffer gas before introducing these mixtures into the reactor. The borosilicate glass produced and other information as to the process conditions and apparatus are given in the article "Glass Source B Diffusion in Si and $SiO_2$" by D. M. Brown and P. R. Kennicott, Journal of the Electrochemical Society, Vol. 118, No. 2, pp. 293–300 (Feb. 1971). A different method for formation of the boric oxide-silicon dioxide glass layer, which is also satisfactory, is by exposure of the oxidized wafer in a boron diffusion furnace at elevated temperature.

Figure 10:
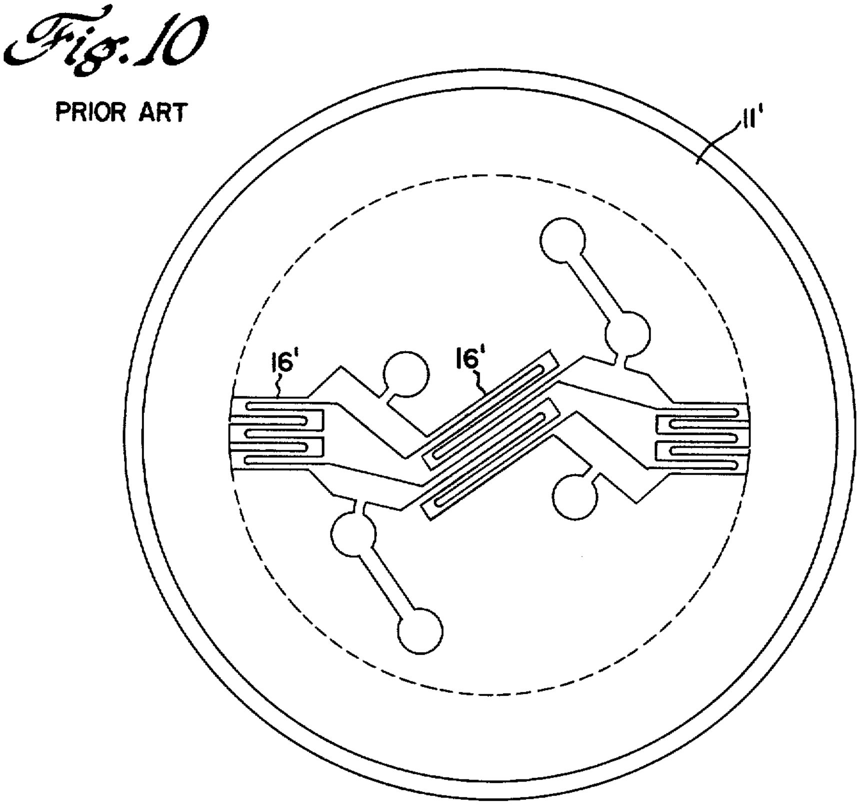
FIG. 10 is a plan view of a completed dielectrically isolated integral silicon diaphragm.
Figure 11:
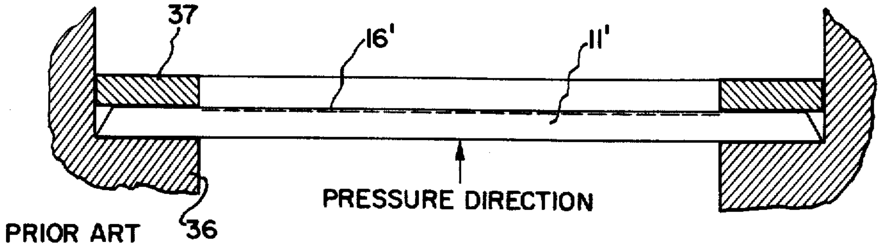
FIG. 11 is a side view of the diaphragm of FIG. 10 mounted rigidly at the edges to flex in response to pressure.

As the next step in the preparation of temporary silicon substrate 12, the flat polished surface of the wafer is provided with a deposited or thermally grown insulating silicon dioxide layer 15. This thin insulating layer is patterned using conventional photomasking and etching techniques to expose the surface of the underlying silicon substrate 12 in a selected pattern corresponding to the geometry of the single crystal strain gages or other components to be fabricated. Suitable patterns for integral silicon diaphragms are illustrated and described in detail, for example, in the inventor's U.S. Pat. No. 3,537,319, granted Nov. 3, 1970, and also in U.S. Pat. No. 3,697,918, granted Oct. 10, 1972 to the inventor and E. D. Orth, both assigned to the same assignee as this invention. Strain gage elements as there shown comprise a continuous thin strip of silicon reverse bent back upon itself in accordian fashion, so that the showing in FIGS. 1–3 can be considered to be diagrammatic. FIG. 10 corresponds to FIG. 1 of U.S. Pat. No. 3,537,319 and shows a plan view of a completed silicon diaphragm 11' with a dielectrically isolated strain gage component or pattern comprising a plurality of interconnected strain gage elements 16'. The four gage elements 16' and interconnecting strips with circular contact pads are in a Wheatstone bridge arrangement. FIG. 11 is a side view of the pressure responsive diaphragm mounted in a bore in a housing structure 36 and retained in place by a ring 37, so that the diaphragm flexes as a function of the pressuring acting on it.

Figure 1:
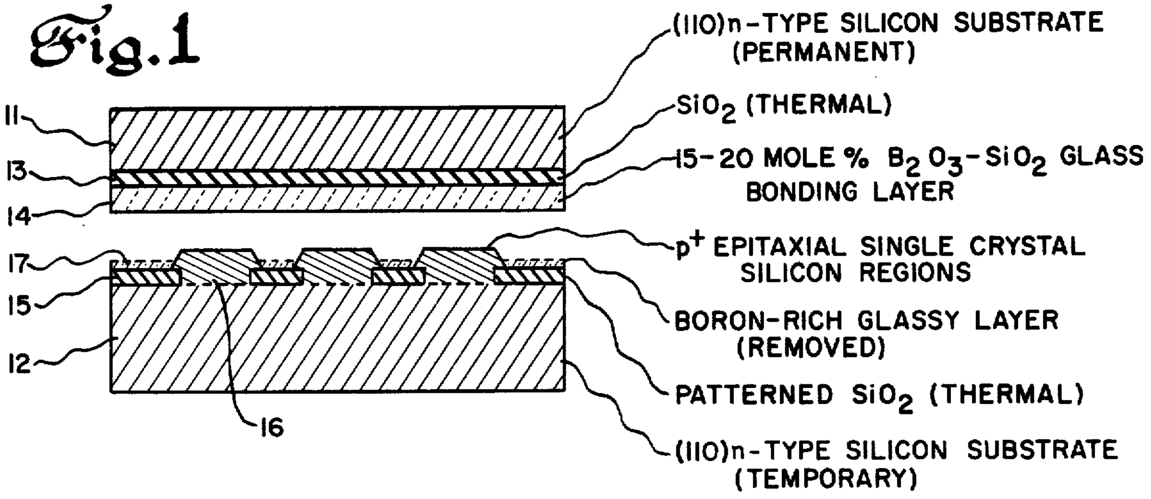
FIG. 1 is a diagrammatic cross-sectional view of a temporary single crystal silicon substrate with a fabricated single crystal silicon strain gage or other component, in condition to be bonded to a permanent single crystal silicon substrate prepared with a boron-enriched glass bonding layer.

The p-type strain gage elements 16 are deposited or grown on the bare n-type silicon using the silicon dioxide layer 15 as a mask. Preferably, the opposite conductivity type regions 16 are $p^+$ epitaxially grown regions fabricated by techniques well known in the art. For example, the iodine-epitaxy process can be employed with conditions adjusted to favor formation of smooth deposits where silicon is exposed and minimal spurious deposition on the oxide layer. A boron doped source is employed having a resistivity of approximately 0.0007 ohm-centimeter so that the grown silicon layer has a boron concentration of approximately $1 \times 10^{20}$. Deposit thickness can be varied in the range of 0.5 to 4.0 microns to obtain the desired resistance of the strain gage elements that are formed. A preferred minimum thickness is 1.5 microns so that the surface level of the p-type silicon elements is somewhat above the oxide surface as shown in FIG. 1. Alternatively (not here illustrated) the p-type regions can be formed on or in the exposed patterned surface of silicon substrate 12 by a standard diffusion process. The diffusion at elevated temperatures may create a very thin boron-rich glassy layer on the surface of oxide layer 15, indicated by dashed lines at 17. This unwanted glassy layer commonly has a thickness of less than 1 micron and is removed, if it is formed as just described or as a by-product of some other semiconductor processing step. Except for planar surfaces, such a very thin boron-rich glassy layer is much too thin to be used as a glass bonding layer as herein described since it limits the flatness of the surface bonded. Also, because of its high $B_2O_3$ content and consequent high expansion coefficient, crazing frequently results in cooling which weakens the bond achievable between the two silicon wafers. If the p-type regions are formed by diffusion, it is then necessary to strip the oxide and preferentially etch the silicon to form p-type mesa regions slightly elevated above the remainder of the surface. Failure to do this can cause gas entrapment and consequently imperfect bonding.

Figure 2:
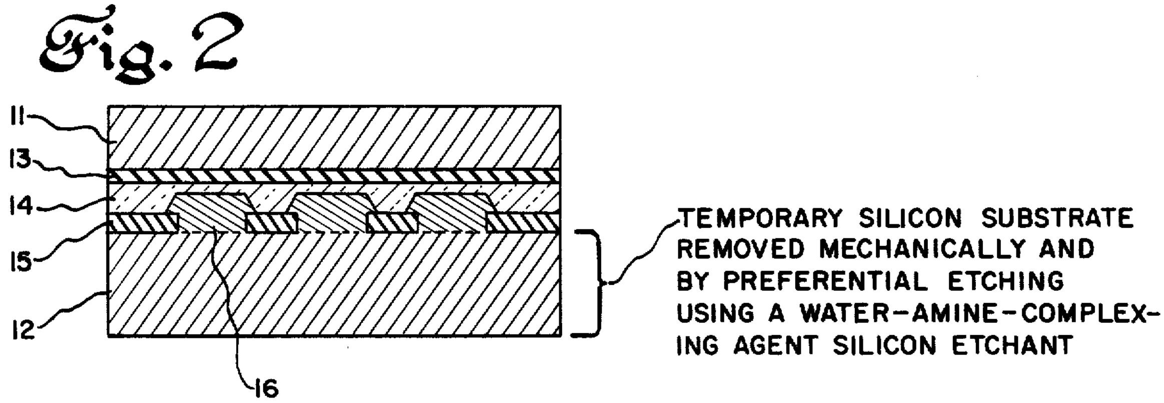
FIG. 2 shows the composite single crystal silicon structure after bonding at an elevated temperature under pressure.

Referring to FIG. 2, the prepared permanent silicon substrate 11 with the oxide layer 13 and glass bonding layer 14, and the prepared temporary silicon substrate 12 with the patterned oxide layer 15 and single crystal silicon strain gage elements 16, are bonded together at elevated temperature under controlled pressure conditions using a press of the type shown in FIG. 4. During the bonding operation the boric oxide-silicon dioxide glass layer 14 softens and flows around the somewhat higher epitaxially grown p-type regions 16 into contact with the surface of the oxide layer 15. A good, permanent bond is formed between the glass layer 14, which hardens when the temperature is reduced and the surface of the individual single crystal silicon strain gage regions 16. One type of furnace and press apparatus that can be used for the practice of the bonding process is illustrated schematically in FIG. 4. Within a tubular furnace, the walls of which are illustrated diagrammatically at 20, is mounted a stainless steel support 21 for supporting the assemblage of lay-ups that are used in the press. A number of thin sheets of mica 22 are employed as a lubricant in the press and to catch the flowing or dripping molten glass. Starting at the top, the assemblage includes an upper stainless steel support 23, a mica sheet 22, and a quartz flat 24. Next, the prepared single crystal silicon permanent substrate (elements 11, 13, and 14) and the prepared single crystal temporary substrate (elements 12, 15, and 16). Below the two prepared silicon substrates to be joined are a pair of mica sheets 22, a glass compliant layer 25, and a final mica sheet 22. The softening point of the glass compliant layer 25 under pressure is about 700°C, lower than that of the boric oxide-silicon dioxide glass bonding layer 14. It not only flows under pressure but is thicker than layer 14 so that it can flow more. A suitable pressure applying mechanism, not here illustrated, applies a controlled and preselected pressure to the upper stainless steel support 23.

A typical set of operating conditions that produces a good bond of one single crystal silicon structure to another when prepared as herein described is to maintain the assembly at 900° for about 1 hour, while applying an average pressure across the prepared substrates of approximately 400 psi. In general, the temperature required depends on the composition of the glass bonding layer and the pressure level and time applied. It usually exceeds 650°C for several hundred psi applied for at least ½ hour. Since it is important that the silicon be maintained flat to insure uniform bonding, the wafers or prepared substrates are pressed between fused quartz flats, or alternatively as is here illustrated, where compliance is advantageous another material such as the glass layer 25 or a metal layer may be included in the lay-up. As was previously mentioned, the softening point of the particular boric oxide-silicon dioxide glass insulating layer 14 that is used in the preferred embodiment is 850°C. When heated and softened to this degree, as is recognized by those skilled in the glass fabricating arts, the glass flows under controlled loading, although it is not sufficiently soft to flow by gravity. Under these controlled conditions of pressure and temperature, the glass bonding layer flows into contact with the uneven or contoured surface of the prepared temporary substrate 12, forming a good bond to both the single crystal regions or strain gage elements 16 and the surrounding silicon dioxide insulating layer 15. Since the glass bonding layer 14 is relatively thick, preferably about 2–3 microns, perfect flatness of the different surfaces that are joined is not required.

Figure 3:
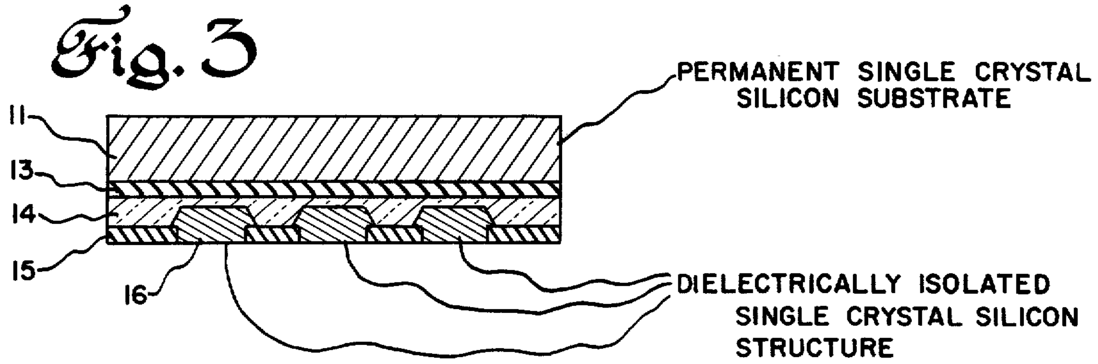
FIG. 3 shows the complete single crystal silicon structure with dielectrically isolated single crystal silicon strain gages, obtained after removal of the temporary substrate mechanically and by preferential etching using a specially selected silicon etchant.

After cooling to room temperature, the temporary silicon substrate 12 is removed from the bonded composite by mechanical methods followed by preferential etching (see FIGS. 2 and 3). For example, the composite is mounted in a lapping fixture and the thickness of temporary substrate 12 is reduced to 25 microns. Grinding or some other precision abrading process can also be employed to remove all but a thin layer of the n-type silicon. Following this a chemical polish such as Lustrox 1000, which is manufactured by Tizon Chemical Corp., is used to remove further material and provide a smooth damage-free surface. At the completion of the chemical polishing operation, the remaining thickness of substrate 12 is about 12 microns. Final removal of the temporary substrate is accomplished using a specially selected silicon etchant that has been found to be highly preferential to n-type silicon as opposed to heavily doped p-type silicon. In particular, the preferential etchant for the process being described is made up in the ratio of 16 ml $H_2O$, 34 ml ethylene diamine, and 6 gm pyrocatechol. This water-amine-complexing agent system for etching silicon is selected because it is readily controlled, provides smooth etched surfaces, and does not damage the oxide layers. It is extremely anisotropic, etching the (100) and (110) directions on the order of 20 to 30 times faster that the (111) crystalline direction. For detailed information on this etchant the reader is referred to the article "A Water-Amine- Complexing Agent System for Etching Silicon" by R. M. Finne and D. L. Klein, Journal of the Electrochemical Society, Vol. 114, No. 9, pp. 965–970 (September 1967).

An especially desirable characteristic of this etching solution not recognized by the foregoing publication is that it is preferential for n-type silicon (and also lightly doped p-type silicon) relative to heavily boron-doped p-type silicon. This is important in the present application in that the yield of useful devices and structures is not so critically dependent on the uniformity of the silicon layer thickness at the start of the final etch. Thus it is possible to form thinner dielectrically isolated layers of uniform thickness. Layers with a thickness of 1–2 microns can be fabricated using the preferential etch from silicon layers which may vary ±5 microns at the conclusion of the polishing operation. The preferential etching characteristic is evident in FIG. 5, in which the etching rate of silicon in suitable units is plotted against the boron impurity concentration in the silicon. The etching rate is high and relatively uniform up to a concentration of about $5 \times 10^{19}$ atoms/cc, but begins to decrease rapidly when the concentration is between this level and $10^{20}$ atoms/cc or so. For heavily boron-doped silicon etching proceeds very slowly. For example, the water-amine-complexing agent etchant removes n-type silicon at a rate of 0.25 microns/minute in the (110) direction with negligible attack on the oxide layers. Completion of the final etching operation is readily apparent because gas bubble evolution from the surface of the wafer rapidly diminishes and the patterned silicon structure becomes visible.

After removal of temporary silicon substrate 12, the resulting semiconductor structure shown in FIG. 3 is, when turned right-side up, an integral silicon diaphragm having dielectrically isolated single crystal silicon strain gage elements with a single crystal silicon substrate. Processing from this point on is conventional. Aluminum contact pads are added and the diaphragms are cut from the composite wafer. This semiconductor structure has good mechanical properties, has matched thermal expansion coefficients for the main constituent parts, and is suitable for applications in high temperatures above 250°F or in high radiation environments. They are usable up to a maximum temperature of at least 750°F. At these elevated temperatures ordinary pn junction-isolated diaphragms are useless because of the high level leakage current. One such application where the new dielectrically isolated integral silicon diaphragm is required is for pressure transducers in aircraft jet engines.

Figure 6:
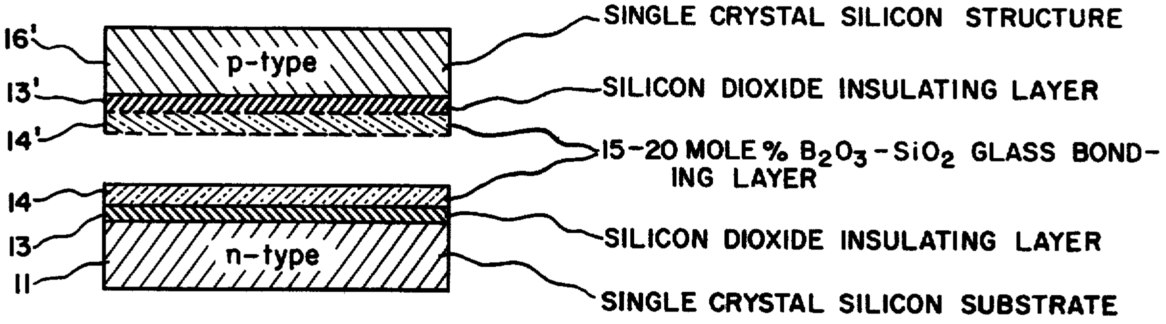
FIG. 6 illustrates modifications of the single crystal structures suitable for bonding, specifically that one or both substrates can have the silicon dioxide insulating layer and boron-enriched glass bonding layer.

FIG. 6 illustrates some of the modifications of the bonding process that may be suitable for certain single crystal semiconductor structures, devices, or components and for certain applications. The preferred embodiment has been discussed with regard to the n-type single crystal silicon substrate 11 provided with silicon dioxide insulating layer 13 and the relatively thick boric oxide-silicon dioxide glass bonding layer 14 with added boron to lower the softening point. This structure is bonded to the p-type single crystal silicon structure 16' having boron as the acceptor impurity. As modifications to this structure and method, either one or both of the single crystal silicon structures being joined can have a silicon dioxide insulating layer and a boric oxide-silicon dioxide glass bonding layer. Thus, within the broader scope of the invention, the p-type structure 16' can have a silicon dioxide insulating layer

13', or can have both the insulating layer 13' and a boric oxide-silicon dioxide glass bonding layer 14'. Of course, the structure 16' with the layers 13' and 14' can be bonded to the substrate 11, or the substrate 11 having the oxide layer 13, or both the oxide layer 13 and the glass bonding layer 14. Moreover, the glass bonding layer can be formed directly on bare silicon while the silicon dioxide insulating layer is on the other silicon member. The invention can also be practiced with an aluminum-enriched glass bonding layer that is bonded to a p-type single crystal silicon structure having aluminum as the acceptor impurity. The various modifications to the structure and method as just discussed can also be employed. Further, as has been mentioned, appropriate semiconductors other than silicon can be used.

Figure 7:
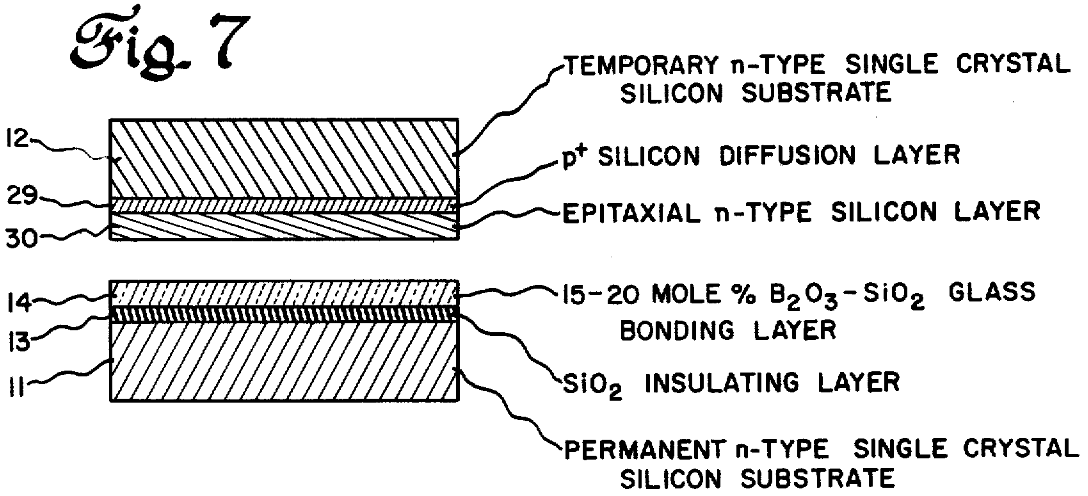
FIG. 7 is a diagrammatic cross-sectional view similar to FIG. 1 showing the prepared permanent and temporary substrates for use in making dielectrically isolated single crystal silicon components such as monolithic and hybrid integrated circuits, and power semiconductor devices.
Figure 8:
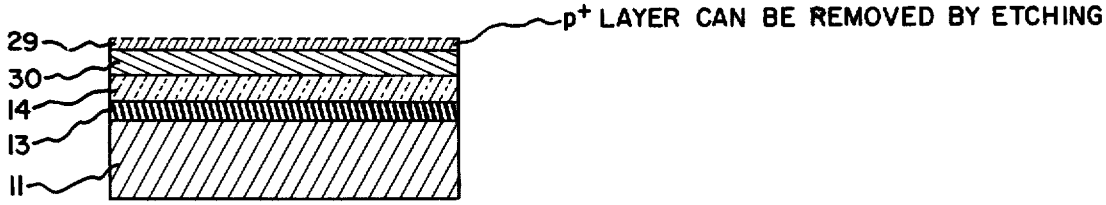
FIG. 8 is similar to FIG. 3 and illustrates the bonded dielectrically isolated structure in condition for fabrication of the remainder of the integrated circuit or power device.

The embodiment of the invention illustrated diagrammatically in FIGS. 7 and 8 is a dielectrically isolated single crystal silicon structure in a form suitable for the subsequent fabrication of monolithic and hybrid integrated circuits, and power semiconductor devices such as the thyristor and transistor. The operation of these solid state components, especially power semiconductors, generates heat that raises the temperature of the material to a level where, for many devices in a large number of applications, it is deirable to provide a dielectrically isolated substrate. Also, very thin isolated layers of silicon are useful for MOS devices (i.e., metal-oxide-semiconductor transistors) and light sensing devices. In a typical process, the permanent silicon substrate 11 is prepared as before with a thermally grown $SiO_2$ insulating layer 13 and a relatively thick boron-enriched glass bonding layer 14. The temporary silicon substrate 12 is processed using conventional diffusion technology to form a heavily boron-doped $p^+$ silicon diffusion layer 29 on the surface of the n-type material. Thereafter an epitaxial n-type single crystal silicon layer 30, relatively thick, is grown on the $p^+$ diffusion layer. The thickness of n-epitaxial layer 30 is commonly several microns or greater depending on the end use. The two substrates as so processed are bonded together at elevated temperature under pressure as previously described at length. After cooling, the temporary n-type substrate 12 is removed by grinding or lapping, chemically polishing, and etching the remaining thin layer using the preferential silicon etch. The integrated circuit or power semiconductor device can be fabricated using the $p^+$ diffusion layer and n-epitaxial layer, and if desired as is shown in FIG. 8 the $p^+$ diffusion layer 29 can be etched off and the integrated circuit or power semiconductor can be fabricated in or on the surface of n-epitaxial layer 30 as is widely practiced.

Figure 9:
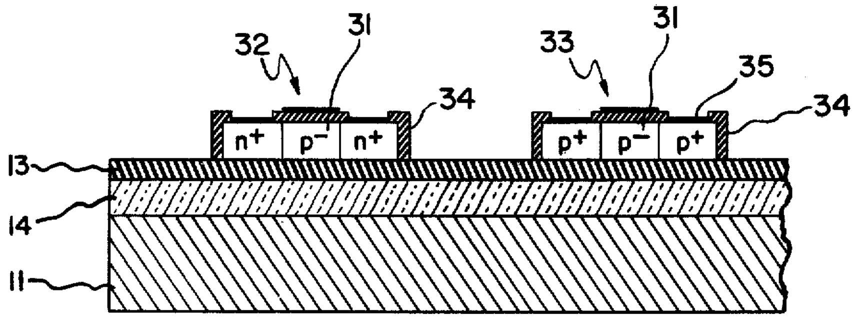
FIG. 9 shows a thin, dielectrically isolated, doped semiconductor layer after subsequent processing into complementary MOS devices as used in memory cells.

FIG. 9 is an example of the utilization of the thin isolated single crystal silicon layers possible through the use of the process just described to form complementary metal-oxide-silicon (CMOS) transistors for a memory application. In this processing sequence, the permanent substrate 11 is provided directly with the glass bonding layer 14. The temporary substrate (not here shown) can be a lightly doped p-substrate that is initially provided with a $p^+$ layer, then a $p^-$ layer 31, and finally the thin silicon dioxide layer 13. After bonding the oxide layer 13 and glass layer 14 as previously described, the $p^-$ temporary substrate is removed by abrading followed by the preferential etching using the water-amine-complexing agent etch, and the $p^+$ layer is also removed by a suitable etchant. Now the remaining $p^-$ layer 31 is processed by a sequence of masking, etching, and diffusion steps to produce the N-channel MOS transistor 32 and the P-channel transistor 33. The N-channel device has $n^+$-$p^-$-$n^+$ regions, while the P-channel device has $p^+$-$p^-$-$p^+$ regions. By techniques well known in the art, insulating layers 34 and contact metallizations 35 are applied to the semiconductor regions. The thinner semiconductor regions are desirable in that the resulting MOS transistor requires low power and has improved speed.

In summary, the new dielectrically isolated single crystal semiconductor product suitable for high temperature or high radiation environment applications comprises a single crystal structure or substrate bonded to another single crystal substrate with at least one intermediate insulating layer and glass bonding layer. The glass bonding layer is characterized by a low softening temperature and desirably has a thermal expansion coefficient matching that of silicon or other semiconductor material. In the fabricating method, a distinctive step, in addition to the bonding process, is the removal of the temporary substrate by the final use of a preferential etchant by means of which thinner semiconductor layers can be obtained. The invention can be employed for the fabrication of many single crystal components, active devices, and integrated circuits.

While the invention has been particularly shown and described with reference to several preferred embodiments thereof, it will be understood by those skilled in the art that the foregoing and other changes in form and details may be made therein without departing from the spirit and scope of the invention.

What I claim as new and desire to secure by Letters Patent of the United States is:

1. A dielectrically isolated integral silicon diaphragm comprising a pressure responsive single crystal silicon substrate, a patterned silicon dioxide layer having at least one opening in which is formed a single crystal silicon strain gage component, said single crystal silicon substrate and said patterned silicon dioxide layer with a single crystal silicon strain gage component being completely dielectrically isolated and bonded together with at least one other intermediate silicon dioxide insulating layer and one intermediate glass bonding layer, said glass bonding layer consisting essentially in mole percent of 15–20 percent boric oxide and 80–85 percent silicon dioxide, and having a thermal expansion coefficient that approximately matches the thermal expansion coefficient of silicon said substrate being made of n-type silicon, and said glass bonding layer having a thickness between 0.5 and 5 microns.

* * * * *